United States Patent [19]
McMullen et al.

[11] Patent Number: 5,973,631
[45] Date of Patent: Oct. 26, 1999

[54] TEST CIRCUIT AND METHOD OF TRIMMING A UNARY DIGITAL-TO-ANALOG CONVERTER (DAC) IN A SUBRANGING ANALOG-TO-DIGITAL CONVERTER (ADC)

[75] Inventors: Donald G. McMullen, Rancho Santa Margarita; Erick M. Hirata, Torrance; Lloyd F. Linder, Agoura Hills; Adam Wu, Agoura, all of Calif.

[73] Assignee: Raytheon Company, Lexington, Mass.

[21] Appl. No.: 09/009,612

[22] Filed: Jan. 20, 1998

[51] Int. Cl.$^6$ ........................................................ H03M 1/06

[52] U.S. Cl. ............................................ 341/144; 341/121

[58] Field of Search .................................... 341/144, 155, 341/120, 121

[56] References Cited

U.S. PATENT DOCUMENTS 4,947,169  8/1990  Smith et al. ............................. 341/121

OTHER PUBLICATIONS

Stewart S. Taylor et al., "A Dynamically Precise 50 MHz 12–Bit DAC Using Laser–Wafer Trimming", *Proceedings of the Midwest Symposium on Cicuits and Sytems*, 1983, pp. 1–5.

Paul Horowitz, Winfield Hill, *The Art of Electronics*, Cambridge University Press, New York, 1989, pp. 621 and 622.

*Primary Examiner*—Brian Young
*Attorney, Agent, or Firm*—Leonard A. Alkov; William C. Schubert; Glenn H. Lenzen, Jr.

[57] ABSTRACT

In a subranging ADC, the unary DAC is trimmed by walking through its transfer function while toggling an offset cell at the input to the coarse quantizer and a reference cell in the DAC such that the reference cell is substituted for the cell under test on alternating cycles to provide the last lsb of the reconstructed signal. A test circuit measures the voltage at the output of the summing amplifier for both conditions and generates an error voltage in which the common mode terms have been rejected. The cell under test is then laser trimmed to reduce the error voltage until the cell's DNL error is within an error bound of a tolerance. In one embodiment, the tolerance is dithered to improve spur free dynamic range.

25 Claims, 7 Drawing Sheets

TEST CIRCUIT AND METHOD OF TRIMMING A UNARY DIGITAL-TO-ANALOG CONVERTER (DAC) IN A SUBRANGING ANALOG-TO-DIGITAL CONVERTER (ADC)

GOVERNMENT RIGHTS

This invention was made with U.S. government support, and the government has certain rights in the invention.

BACKGROUND OF THE INVENTION

1. Field of the Invention

This invention relates to trimming schemes for reducing the coarse DAC's nonlinearity errors in a subranging ADC to improve the ADC s spur free dynamic range.

2. Description of the Related Art

Analog-to-digital converters (ADCs) are employed to convert "real world" signals into digital signals that are susceptible to manipulation by digital computers. A subranging ADC uses a dual-pass architecture in which a buffer buffers the input voltage, a pair of resistors converts the input voltage into an input current, and a coarse quantizer quantizes the input voltage and provides a digital signal to a coarse DAC, which "reconstructs" a coarse current signal. A summing amplifier subtracts the coarse current signal from the input current to form a residual signal that is passed to a fine quantizer. The outputs of the coarse and fine quantizers are combined to form an output codeword. The subranging architecture capitalizes on the flash quantizers' speed while substantially reducing the total number of components. Subranging ADCs are discussed by Paul Horowitz, Winfield Hill, *The Art of Electronics,* Cambridge University Press, New York, 1989, pages 621 and 622.

The subranging ADC may exhibit significant nonlinearity errors that tend to repeat in response to an analog input signal. The repetition produces spurs in the ADC's frequency response that distort the signal and reduce its spur free dynamic range. Because the spurs tend to lie very close to the signal frequency, it is difficult and expensive to remove them using conventional filtering techniques.

Assuming a linear S/H circuit, the overall transfer function and, hence, the linearity of the subranging ADC is determined by the coarse DAC. For example, a 6-bit DAC should exhibit 20-bit accuracy in a 13-bit ADC with 20 bits of resolution whereas the fine quantizers may require only 12-bits of accuracy. The DAC's linearity is measured by the deviation of its transfer function from the ideal stair-case transfer function. The DAC's differential nonlinearity (DNL) is defined as the deviation in height between output voltages for adjacent digital codes and the value of 1 LSB. Integral nonlinearity error is the deviation of the DAC's transfer function from a straight line through the centers of the ideal stair-case transfer function and represents the accumulated DNL errors. The sources of DNL and INL errors are primarily attributable to resistor and transistor gain mismatch in the DAC.

Because the coarse DAC has limited resolution, for example 6-bits, it can be practically implemented using a unary rather than a binary topology. In an N-bit DAC, a binary topology uses only N binarily weighted current cells that are controlled by a binary codeword whereas a unary topology uses $2^N-1$ identical current cells that are controlled by a $2^N-1$ bit thermometer code. It is much easier to match the identical current cells than it is to match the binarily weighted current cells. Furthermore, the unary DAC exhibits substantially less glitch when switching. However, because the number of cells increases exponentially with the number of bits, a unary topology is rarely used in stand-alone DACs outside the subranging context. Any mismatch between the unary cells is reduced by laser trimming their bias resistors. The unary topology and laser trim improves the DAC's linearity, and thus reduces its DNL and INL errors directly.

One approach to laser trimming the DAC is to turn the cells on one at a time and trim their respective currents to a given tolerance from the ideal value. The tolerance merely creates a gain error that can be removed with a single gain adjust trim. This type of cell trim scheme can be accomplished in the context of a subranging ADC but requires external circuitry that disables the coarse quantizer and drives the DAC with a digital code that walks a 1 through each cell. Furthermore, this approach ignores and hides the code dependent errors produced by the nonlinear interaction between current cells when the DAC is operated in the context of a subranging ADC. Thus, even if each cell is trimmed perfectly the DAC will still exhibit nonlinearity errors.

Stewart S. Taylor et al. "A Dynamically Precise 50 MHz 12-Bit DAC using laser-Wafer Trimming," Proceedings of the Midwest Symposium on Circuits and Systems, pp. 1–5, 1983 describes a widely used technique for laser trimming DACs, in which a technician walks the DAC through its transfer function while trimming to the ideal cumulative value represented by the stair-case as shown in FIG. 1 of the article. This cumulative trim takes into consideration and compensates for the code dependent errors. However, because the magnitude of the signal varies over a wide dynamic range as the DAC walks up its transfer function, the test circuit cannot take full advantage of its SNR capability. Thus, the circuit's ability to resolve and thus trim the error is reduced as each addition cell is turned on. For example, in a 6-bit DAC if each unary cell ideally conducts 125 microamps with a 1 microamp tolerance, the first cell has to be trimmed to within 1 microamp with a total current of 125 microamps but the last cell has to be trimmed to within the same 1 microamp with a total current of 8 milliamps. Furthermore, the test equipment tends to exhibit its own nonlinearity over the large dynamic range. Thus, the trim compensates for test equipment's nonlinearity thereby inducing it into the DAC.

SUMMARY OF THE INVENTION

In view of the above problems, the present invention provides a test circuit and method for trimming a unary DAC in a subranging ADC that compensates for code dependent errors and takes advantage of the full SNR capability of the test circuit by reducing its maximum dynamic range to 1 lsb to simultaneous reduce both DNL and INL errors.

This is accomplished by fabricating the subranging ADC with a reference unary cell in the coarse DAC and an offset cell at the input to the coarse quantizer. A test circuit walks through the transfer function of the DAC turning on the next cell at each step while toggling the reference and offset cells such that the reference cell is substituted for the cell under test on alternating cycles to provide the last lsb of the reconstructed signal. The test circuit measures the voltage at the output of the summing amplifier for both conditions and generates an error voltage in which the common mode terms have been rejected. The cell under test is then laser trimmed to reduce the error voltage until the cell's DNL error is within an error bound of a tolerance. In one embodiment, the tolerance is dithered to further improve spur free dynamic range.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
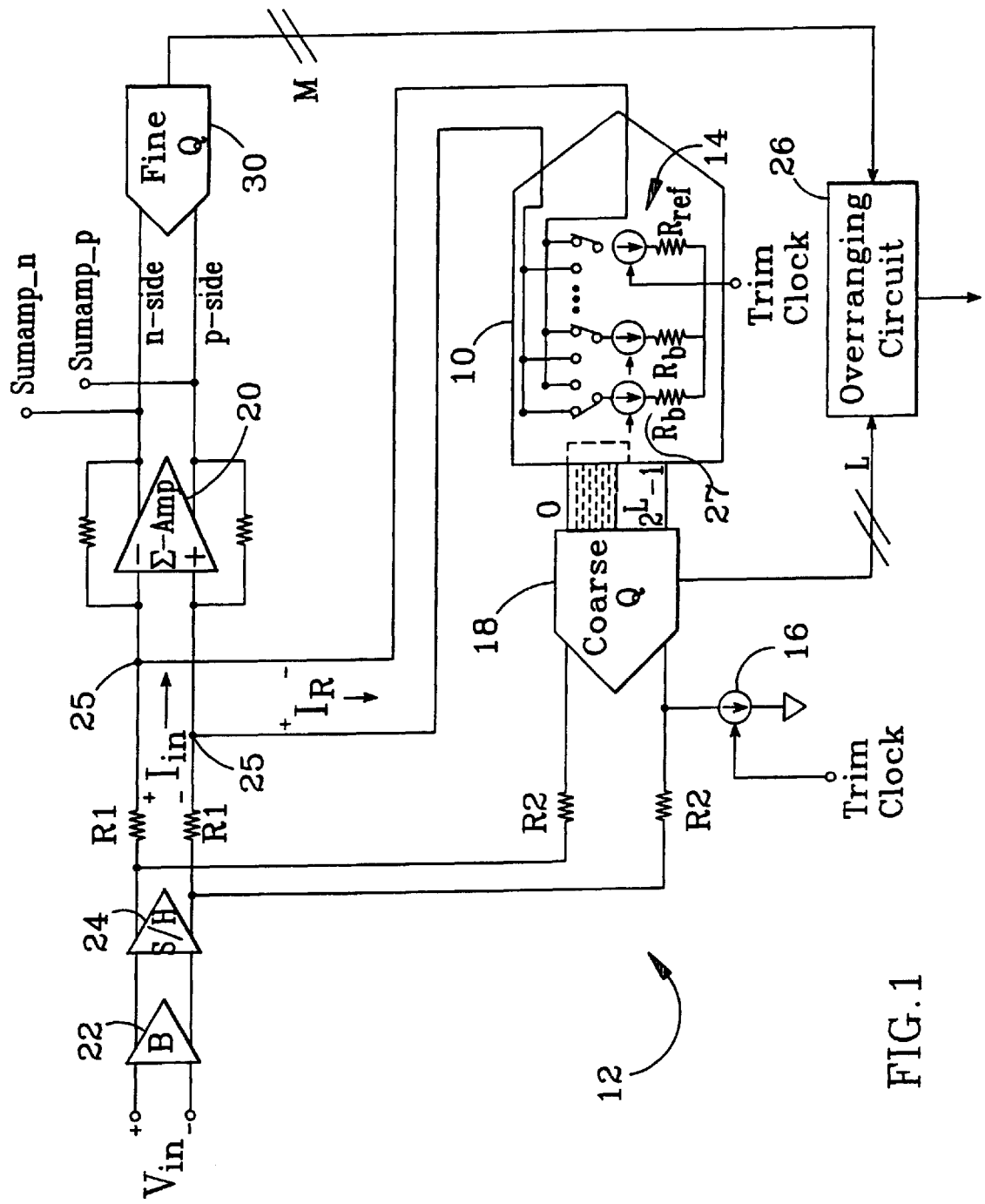
FIG. 1 is a block diagram of a subranging ADC fabricated with reference and offset cells in accordance with the present invention.

The present invention provides a test circuit and method for trimming the coarse DAC 10 in a subranging ADC 12 shown in FIG. 1. The known subranging ADC topology is augmented with a reference cell 14 in unary DAC 10 and a offset cell 16 at the input to a coarse quantizer 18 for the purpose of trimming DAC 10 to reduce its DNL and INL errors. The differential architecture shown having p and n-sides is preferred over a single-ended architecture because it inherently cancels the even order nonlinearities in the DAC. However, the principles discussed are applicable to single-ended implementations.

During normal operation, the offset cell is disabled and the reference cell can either be disabled or switched to one side where it merely provides an offset current that does not effect the transfer function. To trim the DAC, a trim clock toggles the reference and offset cells so that the reference cell is effectively substituted for a cell under test 27 on alternating cycles to provide the last lsb of the reconstructed signal. The cell's bias resistor $R_b$ is laser trimmed to reduce the error between the voltages at the output of the summing amplifier 20 for both conditions until the cell's DNL error is within an error bound of a given tolerance. The tolerance can be fixed or dithered to improve spur free dynamic range. The trim scheme is described in the context of a one-way positive trim but is also applicable to circuit topologies that support a two-way trim.

Subranging ADC 12 captures an analog signal $V_{in}$ using an input buffer 22 that buffers the ADC and a sample and hold (S/H) circuit 24 that is clocked to couple the "held" signal $V_h$ to course L-bit flash-quantizer 18 and summing amplifier 20. Resistor pair R1 convertd the held voltage into an input current $I_{in}$ at summing nodes 25. Course quantizer 18 quatizes the held voltage and outputs both an L bit digital code that is directed to an overranging circuit 26 to provide the ADC's most significant bits and an equivalent $2^L-1$ bit thermometer code to coarse L-bit unary DAC 10. DAC 10 includes $2^L$ ordered unary current cells 27, each corresponding to 1 lsb of the coarse quantizer and having bias resistors $R_b$. $2^L-1$ of the cells switch between the n and p-sides in succession to "reconstruct" a coarse input current at the summing nodes. The other cell is designated as reference cell 14 and has a bias resistor $R_{ref}$.

Summing amplifier 20 subtracts the reconstructed input current $I_R$ from the input current $I_{in}$, gains up and converts the residual signal to a residual voltage $V_F$ and feeds it to a fine M-bit flash-quantizer 30, which converts the residual voltage $V_F$ to a fine digital signal that provides the M least significant bits of the subranging ADC. An extra bit(s) is provided in fine-quantizer 30 to define the "overlap" that compensates for errors in the coarse quantizer 18.

The subranging ADC's overranging circuit 26 adds the L most significant bits (MSBs) with the M LSBs. For 1-bit of overlap, the overranging circuit looks at the MSB of the M LSBs. If it is 1, all of the L-bits are passed with the M−1 LSBs appended thereto. If it is 0, the encoder subtracts 1 LSB from the L-bits and appends the M-1 LSBs thereto.

The subranging ADC is currently fabricated as a hybrid structure in which a plurality of bare dies that are dedicated to the buffer, coarse quantizer-DAC, summing-amplifier, fine quantizer, and timing generator, respectively, are mounted on a ceramic substrate with their leads interconnected via surface traces. Alternately, all of the circuitry could be integrated on a single IC. External pins formed in the ceramic substrate provide I/O between the individual dies and external circuitry. Additional pins for receiving a trim clock that controls toggling the reference cell and cell under test, for measuring the residual voltage, for disabling the offset and reference cells, and switching the polarity of the toggle may be provided. The coarse and fine quantizers and the DAC are trimmed while the hybrid is unsealed. Trim schemes for the coarse and fine quantizers are well known in the art and beyond the scope of the present invention. Once trimming is complete, a lid is placed over the hybrid structure and sealed to form the hybrid subranging ADC package. When in use, the additional trim pins are held in a fixed mode to disable the reference and offset cells.

Figure 2A:
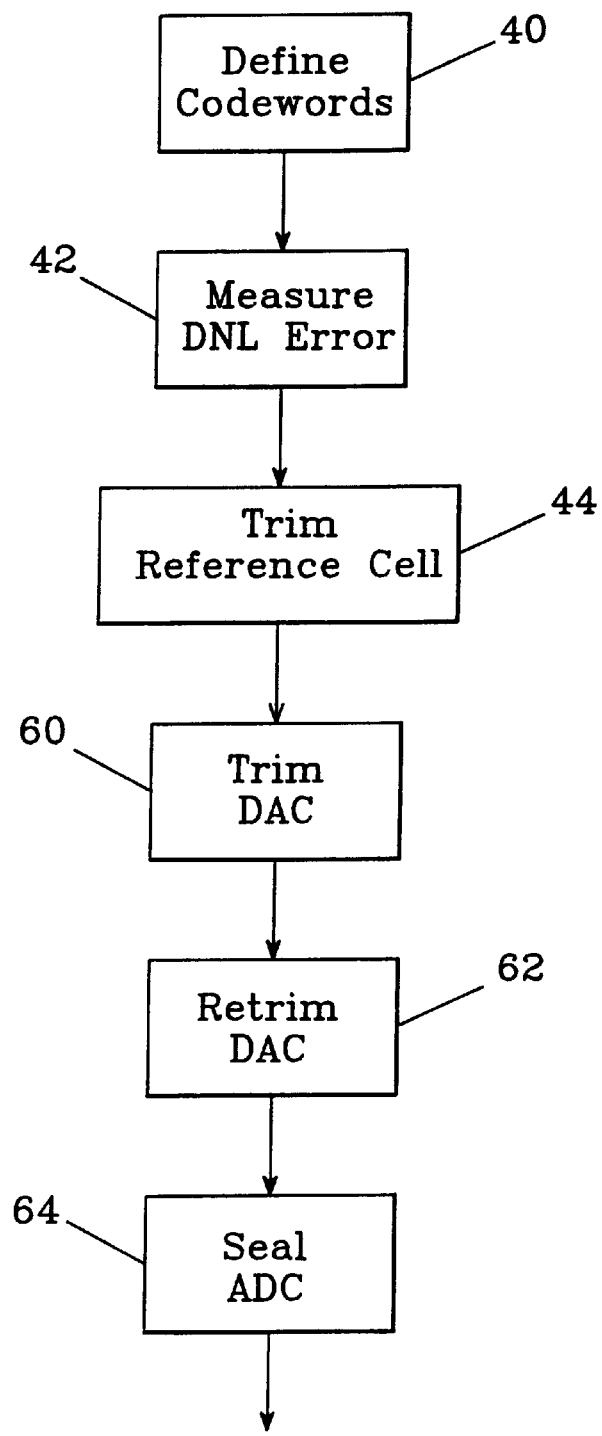
FIGS. 2a and 2b are flowcharts illustrating a method of trimming the unary DAC using a one-way trim.
Figure 2B:
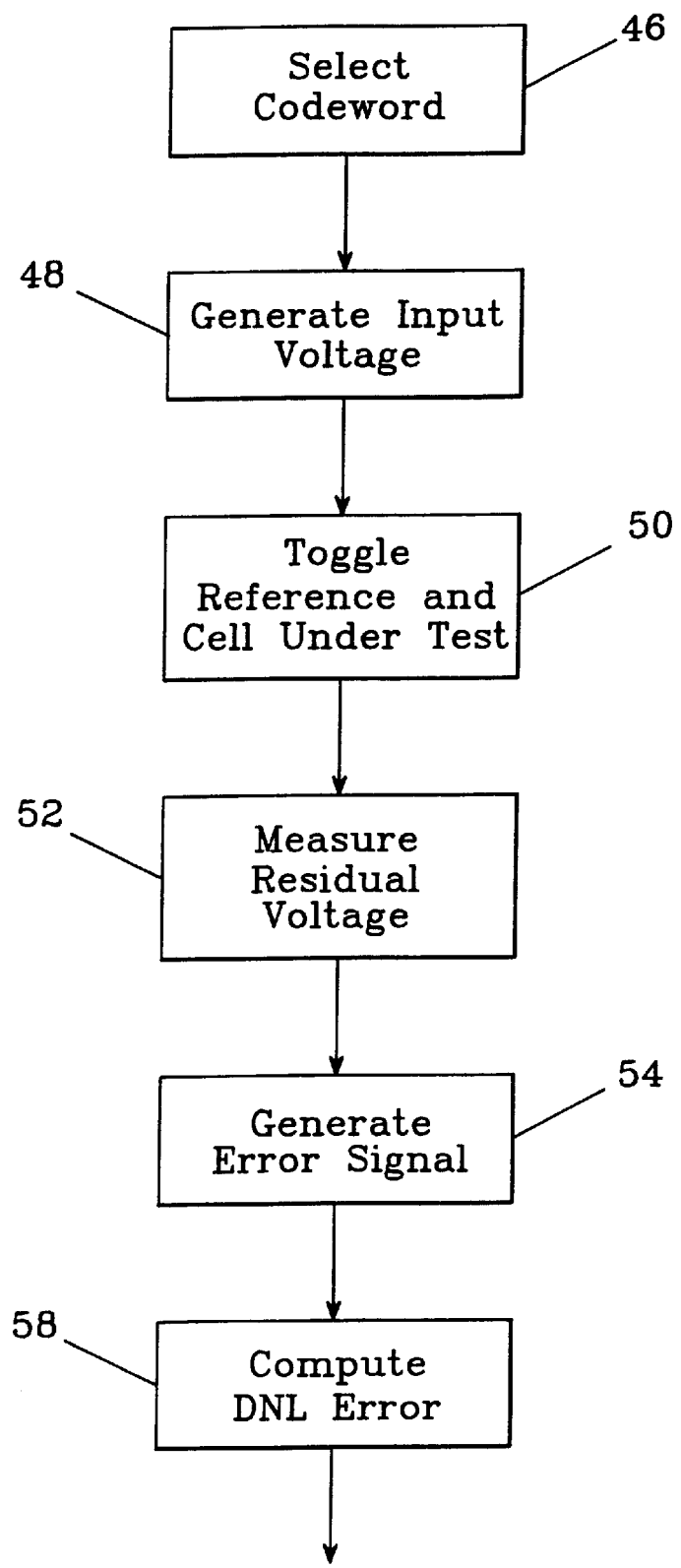

FIGS. 2a and 2b illustrate one approach to trimming DAC 10 in subranging ADC 12 shown in FIG. 1, in which the topology only supports a one-way trim. First, a set of $2^{L-1}$ codewords is defined in which each codeword has an L-bit prefix that corresponds to a different one of the thermometer codes and an M-bit suffix that corresponds to the same fine digital code, preferably mid-scale of the fine quantizer to provide the greatest margin for error when controlling the coarse quantizer (step 40). The test circuit's negative feedback loop keeps the fine portion of the output codeword at mid-scale. Thereafter, the subranging ADC is cycled through each of the codewords in the set to measure the DNL error of each cell with respect to the reference cell (step 42), and if any of the DNL errors are less than zero, the reference cell is laser trimmed so that all the DNL errors are positive (step 44). These two steps would not be required if a two-way trim was employed.

In step 42, the DNL error for each successive cell under test is measured, as shown in FIG. 2b, by selecting the codeword that corresponds to that cell being the last one turned on in the coarse DAC (step 46). An input voltage that approximately equals the ideal voltage associated with the selected code is applied to the subranging ADC so that the coarse quantizer outputs a thermometer code that turns on each cell in the DAC up to and including the cell under test (step 48). A trim clock is then applied that on alternating half-cycles a) controls the offset cell to offset the input voltage by one lsb of the coarse quantizer to turn the cell under test off, e.g. from the p-side to the n-side in the differential topology, and switches the reference cell to provide the last lsb of current, e.g. from the n-side to the p-side and b) controls the offset cell to remove the offset so that the cell under test provides the last lsb (step 50). The voltages output by the summing amplifier are measured for both conditions (step 52) and compared to form an error signal (step 54). Because the measured voltages both include the transfer functions of all of the previously turned on cells, this process rejects that common mode component while incorporating all of the code dependent errors associated with a particular DAC. The cell under test's DNL error with respect to the reference cell is then computed from the error signal (step 58).

Once the DNL errors have all been made positive, a first trim pass is executed (step 60) by measuring the first cell's DNL error using the procedure described in steps 46 through 58, laser trimming the cell's bias resistor until its DNL error is within an error bound, suitably 0.25 ppm, of a tolerance, suitably 5 ppm, from a perfect match, and then repeating the process for each of the remaining cells. The tolerance merely provides a gain error that can be removed with a gain adjust trim. In theory the tolerance could be set to zero, but in practice the tolerance is limited by the accuracy of the test equipment. Once each of the cells has been trimmed once to an initial tolerance, the process is preferably repeated (step 62) to trim the cells to a tighter tolerance, suitably 0.5 ppm. Alternately, the tolerance can be dithered back-and-forth about zero for each successive cell (shown in detail in FIG. 6). Tests have shown that dithering inhibits the overall accumulation of second and higher order errors associated with the DAC and thus further improves spur free dynamic range by about 6 dB. Once completed, a lid is placed on the hybrid subranging ADC and sealed (step 64)

Figure 3:
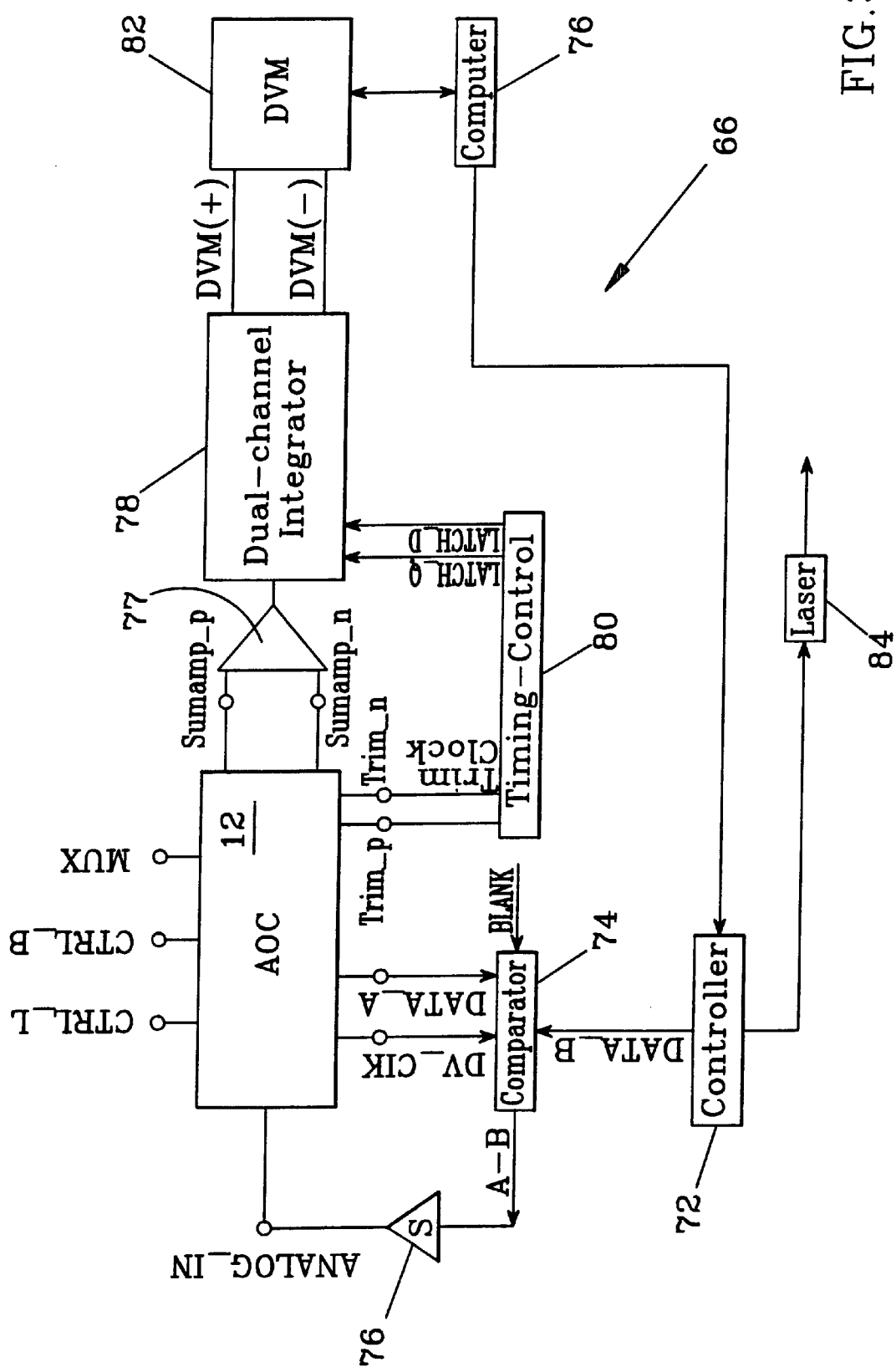
FIG. 3 is a block diagram of a test circuit for trimming the DAC.
Figure 4:
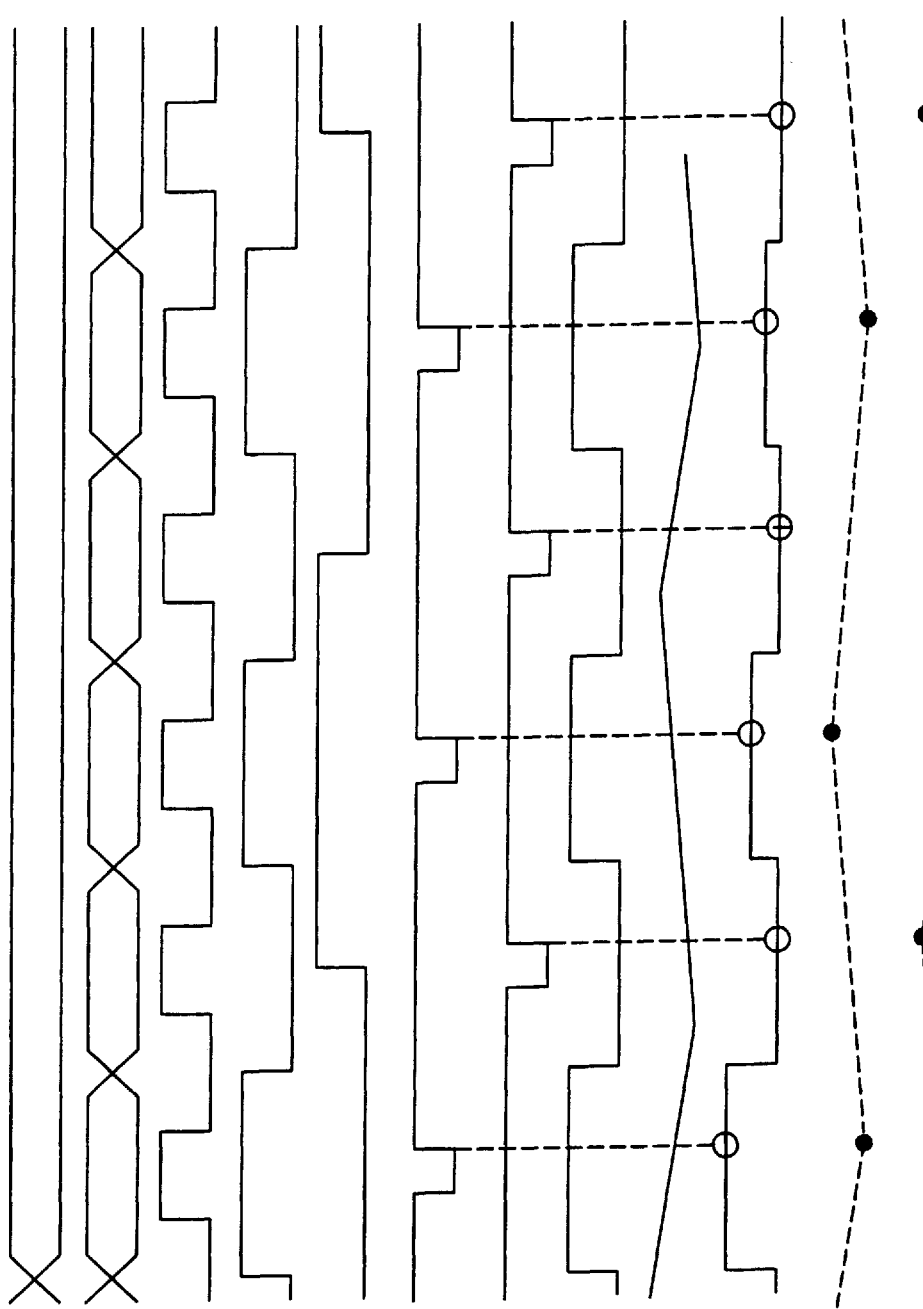
FIG. 4 is a plot of the waveforms associated with the test circuit.

FIGS. 3 and 4 respectively illustrate a test circuit 66 and the timing signals 68 it generates to trim the DAC shown in FIG. 1 in accordance with the method described in FIGS. 2a and 2b. A computer 70 generates a sequence of target codewords drawn from the set, calculates the DNL and INL errors, and potentially controls the laser trim itself. A controller 72 converts the serial data from computer 70 into a parallel target codeword (DATA_B) that is applied with the output codeword (DATA_A) from the subranging ADC to a digital comparator 74 that compares them and outputs a difference signal (A–B). The ADC generates a clock signal (DV_CLK) that is used by comparator 74 to latch the output codeword of the ADC. DV_CLK switches at twice the rate as the trim clock because the trim clock acquires a new value on each half cycle. The test circuit generates another clock signal (BLANK) that disables the feedback loop every other cycle so that the reference cell can be substituted for the cell under test without destabilizing the feedback loop. An integrator 76 connected in the negative feedback loop around the ADC with comparator 74 integrates the difference signal to produce the desired analog voltage (ANALOG_IN) that approximates the ideal voltage associated with the target codeword within 1 or 2 lsbs of the fine quantizer.

A differential to single ended amplifier 77 is connected to sumamp_p and sumamp_n pins at the differential output of the summing amplifier to drive a dual-channel integrator 78 that measures and integrates the residual signal (SUMAMP_OUT). A timing-control circuit 80 generates a trim clock signal (TRIM_CLK) that is applied differentially to pins TRIM_N and TRIM_P on the ADC that on alternating half-cycles a) causes the offset cell to offset the input voltage by one lsb and turn the cell under test off and switches the reference cell to provide the last lsb and b) disables the offset cell so that the cell under test provides the last lsb. Circuit 80 also generates a complementary pair of latch signals (LATCH_Q, LATCH_D) that cause the channels of the dual-channel integrator to measure and integrate the residual signal when the ADC is operating normally and when the reference cell has been substituted for the cell under test, respectively, and generate integrated residual signals (DVM(+) and DVM(–)).

A precision digital voltage meter 82 forms the difference of residual signals DVM(+) and DVM(–), displays that error signal and forwards it to computer 70 that computes the DNL error in ppm for each cell as follows:

$$DNL(n)=((DVM(+)-DVM(-))/(gain*corr*I_{fs}))/1^{-6} \qquad (1)$$

where gain is the gain of the dual-channel integrator and the voltage meter, corr is a correction factor for converting from voltage to current, and $I_{fs}$ is the full-scale current of the DAC. The effective INL error for the $n^{th}$ cell is computed as follows:

$$INL(n,\text{eff})=INL(n-1,\text{eff})+DNL(n,\text{eff}) \qquad (2)$$

where
DNL(n,eff)=DNL(n)–DNL(avg), and
INL(n–1,eff)=Sum(DNL(1,eff) . . . DNL(n–1,eff))
Currently, a technician would control a laser 84 to trim the cell under test's resistor until the DNL and INL errors are within tolerance. However, as shown, the preferable approach would be to have computer 70 control the operation of laser 84.

Because the measured residual signals reflect the response of either the cell under test or the reference cell in addition to all of the previously turned on cells, the error signal rejects that common mode component while incorporating any code dependent errors associated with the normal operation of the DAC. Because the common mode component is rejected, the gain of the DVM can be fixed to take advantage of the meter's full SNR capabilities for each cell by reducing its maximum dynamic range to 1 lsb. Thus, the last cell can be trimmed just as accurately and as easily as the first. Furthermore, the non-linearity exhibited by the dual-channel integrator and voltage meter, and thus induced into the DAC, is reduced significantly.

Figure 5:
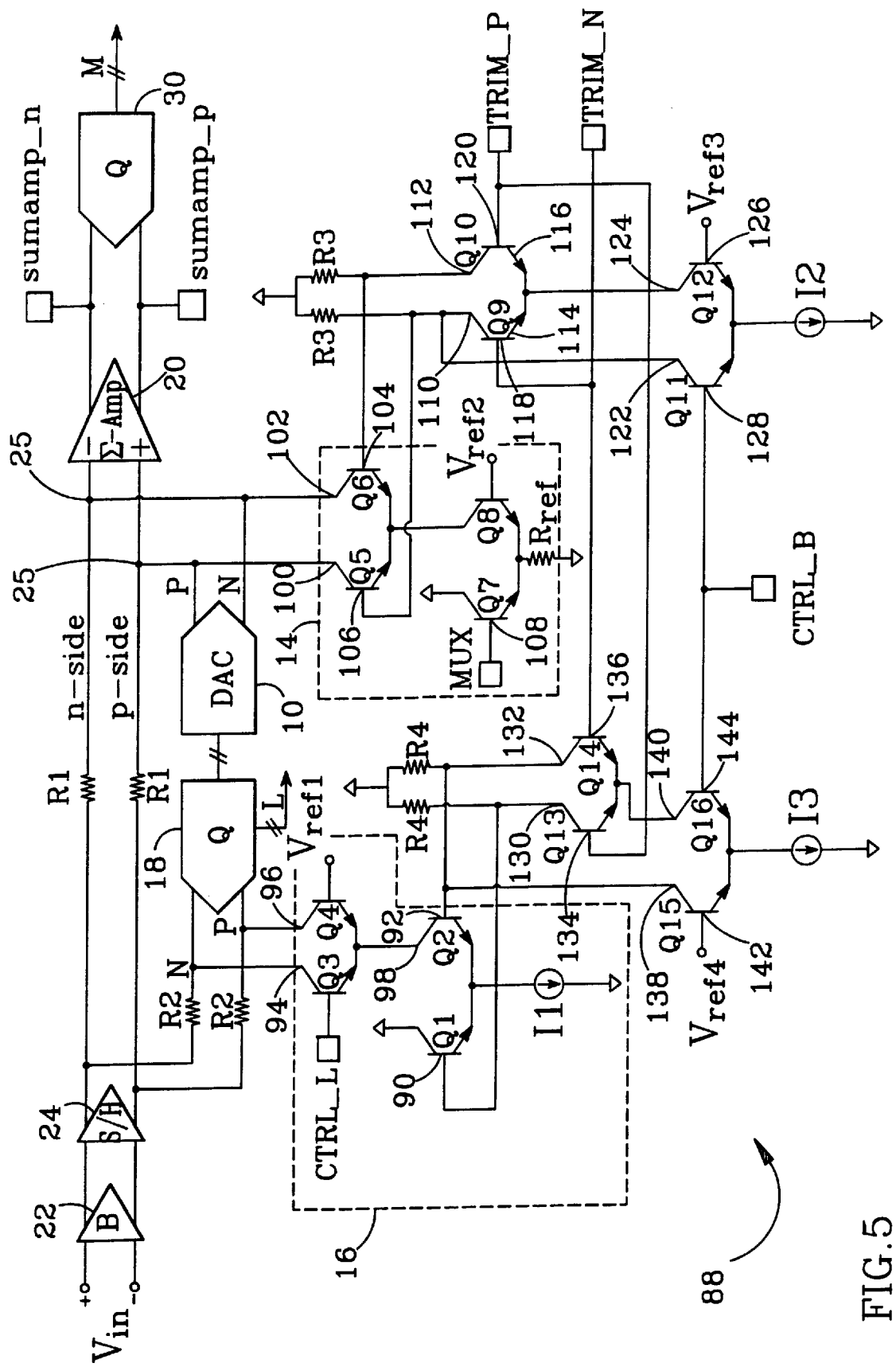
FIG. 5 is a schematic diagram of a portion of the ADC illustrating the control circuitry for toggling the reference and offset cells.

FIG. 5 provides a more detailed view of one implementation of offset cell 16 and reference cell 14 and the control circuitry 88 for toggling them to trim DAC 10. In the depicted implementation, when the DAC is at plus full-scale on the p-side and operating normally, the $2^L-1$ cells (not shown) are switched to draw current from the ADC's p-side and the reference cell 14 is switched to draw current from the ADC's n-side. Note, the reference cell is integrated with the other unary current cells inside DAC 10 but is shown externally for the purpose of explanation. In this configuration, the reference cell provides an offset current. If this is a problem, the reference cell can be disabled when the ADC is in normal operation. The DAC is trimmed starting at positive full-scale pn the P-side and working back towards minus full-scale. This can be changed merely by inverting the polarity of the reference and offset cells.

As implemented, offset cell 16 includes two pair of differentially connected transistors: a first pair, Q1 and Q2, that toggle one lsb of offset current on and off in response to the trim clock, and a second pair, Q3 and Q4, that remove the current from either the n or p-sides of the coarse quantizer. The second pair provide the ability to correct a polarity error if one should occur or to change the direction of trimming from minus to plus full-scale.

The emitters of Q1 and Q2 are connected so that together they supply a bias current I1. To disable offset cell 16, the voltage at the base 90 of Q1 is higher than that at the base 92 of Q2 so that substantially all of bias current is supplied by Q1, effectively starving the offset cell of current. To enable the offset cell, the base voltages are switched so that Q2 draws the tail current from the second differential pair to supply the bias current.

Transistors Q3 and Q4's collectors 94,96 are tied to the n-side and p-side of the differential input to the coarse quantizer 18. Normally, the constant voltage $V_{ref1}$ at the base of Q4 is held higher than the voltage at the base of Q3, which is applied externally through a CTRL_L pin, so that Q4 draws one lsb of current from the p-side to supply the tail current and Q3 is off. The CTRL_L pin allows the polarity to be switched if, for example, a polarity error is designed into the control circuit or it is desired to trim the DAC from minus to plus full-scale. If this type of protection and flexibility is not required, the collector 98 of Q2 can be tied directly to the p-side of the coarse quantizer.

Reference cell 14 includes a pair of differentially connected transistors Q5 and Q6 whose collectors 100,102 are connected to the p-side and n-side summing nodes 25 at the input to the summing amplifier, respectively. Normally, the voltage at the base 104 of Q6 is held above the voltage at the base 106 of Q5 so that reference cell 14 draws current from the n-side summing node. During trimming, the relationship is inverted so that reference cell 14 draws current from the p-side to replace the current lost from the disabled cell under test. A second differential pair Q7 and Q8 connected through a resistor $R_{ref}$ to ground supply reference current for the first pair. An external signal applied through a MUX pin to the base 108 of Q7 controls the generation of reference current so that during normal operation the reference cell can be disabled. If the offset current generated by the reference is not a problem in the particular application the MUX pin and transistor Q7 can be eliminated.

Control circuitry 88 provides an interface between the trim clock and the offset and reference cells so that they operate in harmony to toggle the reference cell to the p-side when the offset cell draws one lsb of current from the p-side of the coarse quantizer and then toggle the reference cell back to the n-side when the offset cell is disabled. The control circuitry comprises four differential pairs: a reference control pair and reference current source, and a offset control pair and tail current source.

The reference control pair Q9 and Q10 have collectors 110, 112 that are connected to the bases 106, 104 of reference cell transistors Q5 and Q6, respectively, and tied through pull-up resistors R3 to a supply voltage, emitters 114, 116 that are connected together to the tail current source, and bases 118, 120 that are connected to the TRIM_N and TRIM_P pins. The tail current source pair Q11 and Q12 have collectors 122, 124 that are tied to the collector 110 of Q9 and the emitters 114, 116 of Q9 and Q10, respectively, and emitters that are tied together to supply a bias current 12. The base 126 of Q12 is held at a reference voltage $V_{ref3}$ that forward biases Q12 so that it supplies tail current to the reference control pair Q9 and Q10. The voltage at the base 128 of Q11 is controlled through a CTRL_B pin. During trimming, the pin is held high, but not high enough to forward bias Q11. If the CTRL_B pin is driven higher than the base of Q12 control of the reference cell is disabled.

The offset control pair Q13 and Q14 have collectors 130, 132 that are connected to the bases 90, 92 of offset cell transistors Q1 and Q2, respectively, and tied through pull-up resistors R4 to a supply voltage, emitters that are connected together to the tail current source, and bases 134, 136 that are connected to the TRIM_P and TRIM_N pins. The tail current source pair Q15 and Q16 have collectors 138, 140 that are tied to the collector 132 of Q14 and the emitters of Q13 and Q14, respectively, and emitters that are tied together to supply a bias current I3. The base 142 of Q15 is held at a reference voltage $V_{ref4}$ that turns Q15 off during trimming and forward biases it during normal operation. The voltage at the base 144 of Q16 is controlled through the CTRL_B pin. During trimming, the pin is held high so that Q16 is forward biased and Q15 is off.

To enable the offset and reference cells to trim the DAC, the voltages at pins CTRL_B, MUX and CNTR_L are set high, low and low, respectively. This provides the reference current that can then be switched to control the offset and reference cells.

To trim the DAC from plus full-scale on the P-side to minus full-scale, the test circuit steps through each successive cell while toggling the cell under test and reference cell. In normal operation, where the cell under test provides the last lsb, the TRIM_N pin is high and the TRIM_P pin is low. This causes transistor Q14 to become forward biased thereby drawing collector current through its pull-up resistor R4, which turns transistor Q2 off thereby starving transistor Q4 of current so that the input voltage to the coarse quantizer is not offset. Simultaneously, transistor Q10 is turned off causing its collector voltage to go to the supply voltage, which turns transistor Q6 on thereby drawing current from the n-side summing node.

To switch the reference cell for the cell under test, the feedback loop is disabled, the TRIM_N pin is switched low and the TRIM_P pin is switched high. This turns transistor Q14 off causing its collector voltage to go to the supply, which in turn turns transistor Q2 on thereby drawing one lsb of current through transistor Q4 and p-side resistor R2, which offset the voltage at the input to the coarse quantizer by one coarse quantization level (1 lsb). Simultaneously, transistor Q9 is turned off causing its collector voltage to go to the supply, which turns transistor Q5 on thereby drawing one lsb of current from the p-side of the summing amplifier. Thus, when one lsb is pulled out of the p-side of the coarse quantizer by the offset cell one lsb is switched from the n-side to the p-side at the summing amplifier by the reference cell. Once switched, the feedback look is reconnected and the residual signals for the two conditions are measured at pins sumamp_p and sumamp_n at the output of the summing amplifier.

After the ADC is trimmed and packaged, the offset cell is disabled and reference cell provides an offset current. This can be done in several ways. The easiest is to fix the trim clock so that the offset cell is disabled and the reference cell draws current from the n-side. However, this does reduce dynamic range somewhat and runs the risk of the cells being inadvertently toggled. Thus, the CTRL_B and MUX pins can be held low and high, respectively, thereby disabling the offset and reference cells.

Figure 6:
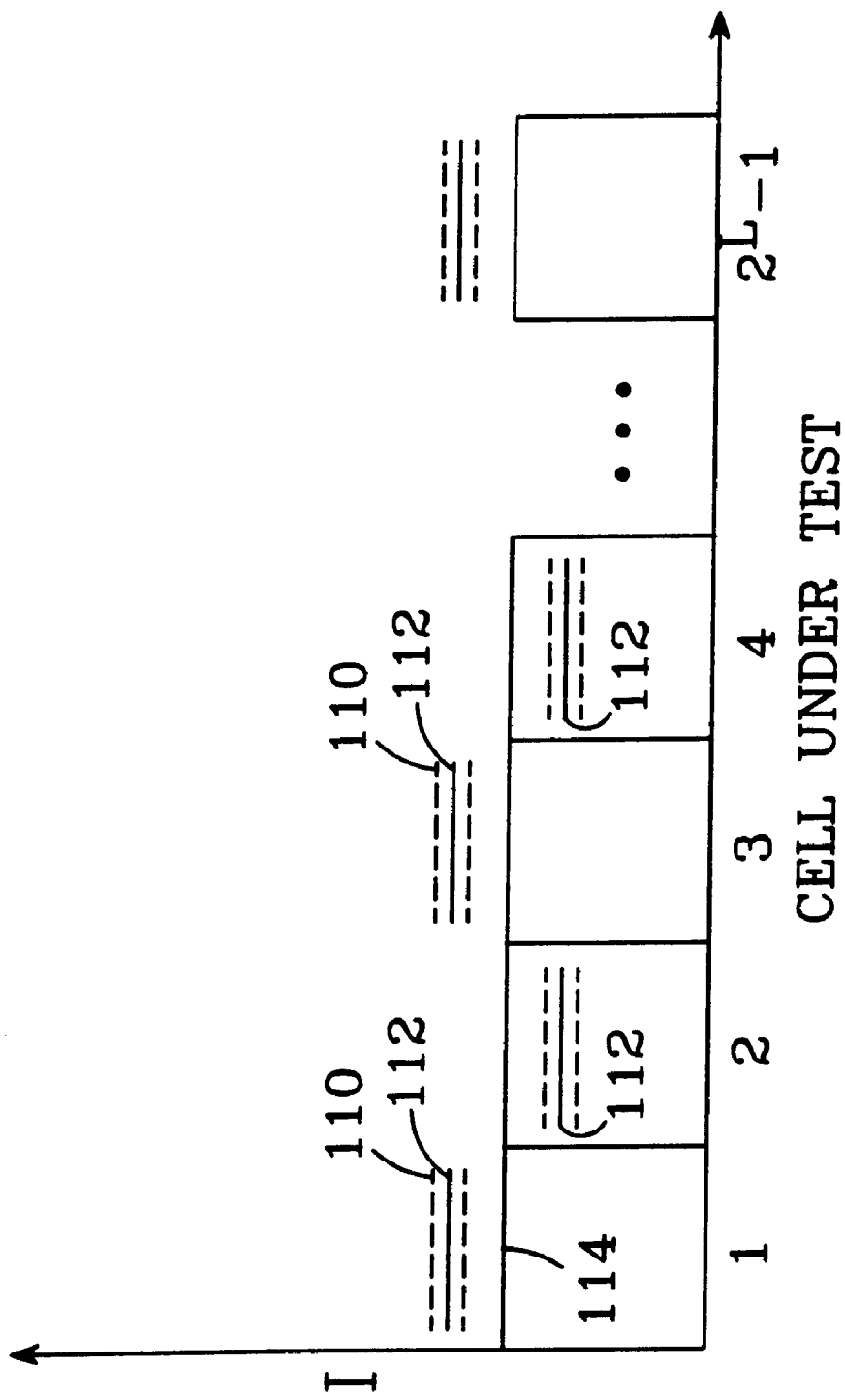
FIG. 6 is a plot illustrating a dither trim of a unary DAC.

FIG. 6 illustrates the dither trim in which the current is trimmed to within an error band 110 of a tolerance 112 from the ideal lsb current 114 where the tolerance is dithered for each successive cell. In a perfect world, dithering the tolerance 112 would have no effect other than to cancel out the gain term produced by the tolerance. However, in practice the coarse quantizer and DAC exhibit second and higher order INL errors that can accumulate. Tests have shown that the dither trim tends to prevent this accumulation of errors and thus improves the ADC's spur free dynamic range by approximately 6 dB. Although the dither trim has been described in the context of the Applicant's on-chip trim scheme, it should be applicable to the known trim techniques in which the cumulative transfer function is trimmed to an ideal value.

While several illustrative embodiments of the invention have been shown and described, numerous variations and alternate embodiments will occur to those skilled in the art. For example, the described subranging ADC uses a current mode topology, which is typical. However, the principles of the invention are equally applicable to a voltage mode architecture. Such variations and alternate embodiments are contemplated, and can be made without departing from the spirit and scope of the invention as defined in the appended claims.

We claim:

1. A method of trimming a unary digital-to-analog converter (DAC) in a subranging analog-to-digital converter (ADC) to reduce the DAC's nonlinearity errors, said ADC comprising a coarse quantizer that quantizes an input signal and provides a thermometer code to the unary DAC and an equivalent coarse digital code, said DAC reconstructs a coarse signal that is applied with the input signal to a summing amplifier that forms a residual signal that is passed to a fine quantizer which outputs a fine digital code that is combined with the coarse digital code to form an output codeword, said unary DAC comprising a plurality of ordered unary current cells that each correspond to one least significant bit (lsb) of the coarse quantizer and turn on and off in succession in response to changes in the thermometer code to reconstruct the coarse signal, each said cell having a bias resistor, comprising:

generating an input signal that causes the coarse quantizer to output a thermometer code that turns on each said cell up to and including a cell under test;

toggling a reference cell and the cell under test to alternately provide the last lsb to reconstruct the coarse signal;

measuring the residual signal output by said summing amplifier;

measuring an error signal between the reference cell's and the cell under test's residual signals thereby rejecting their common mode component while incorporating any code dependent errors associated with the DAC; and trimming the cell under test's bias resistor to reduce the error signal until the cell's DNL error is small enough.

2. The method of claim 1, wherein the input signal is generated by:

providing a target codeword from a set of codewords in which each codeword has a prefix that corresponds to a different one of the thermometer codes and a suffix that corresponds to the same fine digital code;

comparing the target codeword to the output codeword from the ADC to produce a digital difference signal; and integrating the digital difference signal in a negative feedback loop to construct the input signal, which approximately equals the ideal value associated with said target codeword.

3. The method of claim 2, wherein the same fine digital code corresponds to a mid-scale value of the fine quantizer.

4. The method of claim 1, wherein said reference cell and said cell under test are toggled by:

applying a trim clock signal to said subranging ADC that on alternating half-cycles a) offsets the input signal at the input to the coarse quantizer by one lsb to turn the cell under test off and switches the reference cell to provide the last lsb and b) removes the offset so that the cell under test provides the last lsb.

5. The method of claim 4, wherein said DAC comprises $2^L$ unary current cells one of which is designated as the reference cell.

6. The method of claim 5, wherein said input signal is offset by 1 lsb by switching another unary current cell connected at the input to the coarse quantizer.

7. The method of claim 1, wherein the residual signal is measured and the error signal measured by:

connecting a single input dual-channel integrator to the output of the summing amplifier;

clocking the dual-channels on alternating half-cycles to measure and integrate the residual signal corresponding to the reference cell and the cell under test, respectively; and connecting a voltage meter between the dual channels to measure the error signal between the integrated residual signals and reject the common mode component of the coarse voltage.

8. The method of claim 7, wherein the rejection of the common mode component causes the range of the error signal to be approximately the same for each said cell, the gain of said voltage meter being fixed to take full advantage of the meter's signal-to-noise ratio (SNR) capabilities by reducing its maximum dynamic range to 1 lsb.

9. The method of claim 1, wherein the cell under test's bias resistor is trimmed until the cell's DNL error is within an error bound of a fixed tolerance from zero.

10. The method of claim 9, wherein the fixed tolerance is dithered about zero for each successive cell.

11. The method of claim 1, further comprising retrimming each said cell with respect to said reference cell to further improve linearity.

12. The method of claim 1, wherein the cell is trimmed using a one-way trim, further comprising:

measuring the differential nonlinearity (DNL) error of each said cell with respect to the reference cell prior to trimming the cells; and if any of said cells exhibit a negative DNL error, trimming said reference cell so that all said cell exhibit positive DNL errors.

13. A method of trimming a unary digital-to-analog converter (DAC) in a subranging analog-to-digital converter (ADC) to reduce the DAC's nonlinearity errors, comprising:

providing an unsealed subranging ADC, said ADC comprising:

a buffer that buffers an input voltage;

a voltage-to-current converter that converts the input voltage to a pair of equivalent input currents;

a coarse quantizer that quantizes the second input current and generates a coarse digital code and an equivalent thermometer code;

a unary DAC having a plurality of ordered unary current cells that each correspond to one least significant bit (lsb) of the coarse quantizer and turn on and off in succession in response to changes in the thermometer code to reconstruct a coarse current and having a reference cell that can be controlled to provide an additional lsb of current, each said cell having a bias resistor;

an offset current cell at the input to the coarse quantizer that is capable of offsetting the second input current by 1 lsb to turn the last turned-on cell off;

a summing amplifier that forms a residual signal from the first input and coarse currents;

a fine quantizer that quantizes the residual signal and outputs a fine digital code; and a overranging circuit that combines the coarse and fine digital codes to form an output codeword, defining a set of codewords in which each codeword has a prefix that corresponds to a different one of the thermometer codes and a suffix that corresponds to the same fine digital code;

connecting the subranging ADC in a negative feedback loop in which the target codeword is compared to the output codeword to form a digital difference signal that is integrated to construct an input voltage that causes the coarse quantizer to output a thermometer code that turns on each said cell up to and including a cell under test;

measuring the differential nonlinearity (DNL) error of each said cell with respect to the reference cell by cycling through the target codewords in the set while controlling the offset and reference cells to toggle the reference cell and the cell under test, measuring the residual signals, computing an error signal and from that computing the DNL error;

if any of said cells exhibit a negative DNL error, trimming said reference cell's bias resistor so that all said cells exhibit positive DNL errors;

trimming each said cell with respect to said reference cell by cycling through the target codewords in the set while controlling the offset and reference cells to toggle the reference cell and the cell under test to alternately provide the last lsb, measuring the residual signals, computing an error signal from the residual signals that rejects their common mode component while incorporating any code dependent errors in the DAC, and trimming the cell under test's bias resistor to reduce the error signal until the cell's DNL error is small enough; and sealing the subranging ADC.

14. The method of claim 13, wherein said reference and offset cells are controlled by:

applying a trim clock signal to said subranging ADC that on alternating half-cycles a) causes the offset cell to offset the second input current by one lsb and turn the cell under test off and switches the reference cell to provide the last lsb and b) causes the offset cell to remove the offset so that the cell under test provides the last lsb.

15. The method of claim 14, wherein the residual signals are measured using a voltage meter, the rejection of the residual signals' common mode component causes the range of the error signal to be approximately the same for each said cell so that the gain of said voltage meter is fixed to take full advantage of the meter's signal-to-noise ratio (SNR) capabilities by reducing its maximum dynamic range to 1 lsb.

16. The method of claim 13, wherein the cell under test's bias resistor is trimmed until the cell's DNL error is within an error bound of a fixed tolerance that is dithered about zero for successive cells.

17. A test circuit for trimming a unary digital-to-analog converter (DAC) in a subranging analog-to-digital converter (ADC) to reduce the DAC's nonlinearity errors, comprising:

an unsealed subranging ADC comprising:
a coarse quantizer that quantizes an input signal and generates a coarse digital code and an equivalent thermometer code;
a unary DAC having a plurality of ordered unary cells that each correspond to one least significant bit (lsb) of the coarse quantizer and turn on and off in succession in response to changes in the thermometer code to reconstruct a coarse signal and having a reference cell that can be controlled to provide an additional lsb, each said cell having a bias resistor;
an offset cell at the input to the coarse quantizer that is capable of offsetting the input signal by 1 lsb to turn the last turned-on cell off;

a summing amplifier that forms a residual signal from the input and coarse currents;
a fine quantizer that quantizes the residual signal and outputs a fine digital code; and
an overranging circuit that combines the coarse and fine digital codes to form an output codeword,
a computer that generates a sequence of target codewords in which each codeword has a prefix that corresponds to a different one of the thermometer codes and a suffix that corresponds to the same fine digital code;
a digital comparator and an integrator connected in a negative feedback loop around the subranging ADC, said comparator comparing the target and output codewords to form a digital difference signal that the integrator integrates to construct an input signal that causes the coarse quantizer to output a thermometer code that turns on each said cell up to and including a cell under test;
a dual-channel integrator that selectively samples and integrates the residual signal at the output of the summing amplifier;
a timing controller that generates a trim clock signal that on alternating half-cycles a) causes the offset cell to offset the input signal by one lsb and turn the cell under test off and switches the reference cell to provide the last lsb and b) causes the offset cell to remove the offset so that the cell under test provides the last lsb and generates a complementary pair of latch signals that cause the channels of the dual-channel integrator to sample the residual signal when the cell under test and reference cell provide the last lsb, respectively;
a voltage meter that forms and displays an error signal between the different residual signals, said computer computing the cell under test's DNL error from said error signal; and
a laser for trimming the cell under test's bias resistor to reduce the error signal until the cell's DNL error is sufficiently small.

18. The method of claim 17, wherein the rejection of the common mode component causes the range of the error signal to be approximately the same for each said cell, the gain of said voltage meter being fixed to take full advantage of the meter's signal-to-noise ratio (SNR) capabilities by reducing its maximum dynamic range to 1 lsb.

19. The method of claim 17, wherein the laser trims the cell under test's bias resistor until the cell's DNL error is within an error bound of a fixed tolerance that is dithered about zero for successive cells.

20. A subranging analog-to-digital converter (ADC) that provides on-chip trimming of its digital-to-analog converter (DAC), comprising:

an input pin for receiving an input signal;
a coarse quantizer that quantizes the input signal and generates a coarse digital code and an equivalent thermometer code;
a unary DAC having a plurality of ordered unary cells that each correspond to one least significant bit (lsb) of the coarse quantizer and turn on and off in succession in response to changes in the thermometer code to reconstruct a coarse signal, each said cell having a bias resistor;
a trim pin for receiving a trim clock signal that alternates between first and second states;
an offset current cell at the input to the coarse quantizer;
a reference cell having a bias resistor;

a control circuit that responds to the trim clock signal's first state by enabling the offset cell so that it offsets the input signal by 1 lsb to turn the last turned-on cell off and enabling the reference cell so that it substitues for that cell and restores the 1 lsb and responds to the trim clock signal's first state by disabling the offset cell so that the cell under test provides the last lsb;

a summing amplifier that forms a residual signal from the pre-offset input and coarse signal;

a sumamp pin for outputting the residual signals in said first and second states that together reject their common mode component while incorporating any code dependent errors from the DAC and from which the DNL error of each said cell with respect to the reference cell can be computed;

a fine quantizer that quantizes the residual signal and outputs a fine digital code;

an output pin; and an overranging circuit that combines the coarse and fine digital codes to generates an output codeword at the output pin.

21. The subranging ADC of claim 20, further comprising:

a CTRL_B pin for disabling the offset cell; and a MUX pin for disabling reference cell.

22. The subranging ADC of claim 20, further comprising a CTRL_A pin for switching the polarity of the offset cell.

23. A method of trimming a unary digital-to-analog converter (DAC) in a subranging analog-to-digital converter (ADC) to reduce the DAC's nonlinearity errors, comprising:

providing a subranging ADC having a coarse quantizer that quantizes an input signal and provides a thermometer code to the unary DAC, which reconstructs a coarse signal that is applied with the input signal to a summing amplifier that forms a residual signal that is passed to a fine quantizer which outputs a fine digital code that is combined with the thermometer code to form an output codeword, said unary DAC comprising a plurality of ordered unary cells having respective bias resistors and corresponding to one least significant bit (lsb) of the coarse quantizer, said cells turning on and off in succession in response to changes in the thermometer code to reconstruct the coarse signal, said unary DAC exhibiting second and higher order nonlinearities that tend to accumulate and reduce the ADC's spur free dynamic range;

generating an input signal that causes the coarse quantizer to output a thermometer code that turns on each said cell up to and including a cell under test;

measuring the residual signal output by said summing amplifier;

trimming the cell under test's bias resistor to reduce the error between the residual signal and a target value until the cell's DNL error is within an error bound of a tolerance; and dithering the tolerance about zero for successive cells, said dither trimmed cells resisting the accumulation of the DAC's nonlinearity errors thereby improving the ADC's spur free dynamic range.

24. The method of claim 23, further comprising:

toggling a reference cell and the cell under test to alternately provide the last lsb to reconstruct the coarse signal; and computing an error signal between the reference cell's and the cell under test's residual signals, said cell under test's bias resistor being trimmed to reduce the error signal until the cell's DNL error is within an error bound of the dithered tolerance.

25. The method of claim 24, wherein a one-way trim is used to trim the bias resistors, further comprising:

measuring the differential nonlinearity (DNL) error of each said cell with respect to a reference cell prior to trimming; and if any of said cells exhibit a negative DNL error, trimming said reference cell so that all said cell exhibit positive DNL errors.

* * * * *